United States Patent [19]

Maruyama et al.

[11] Patent Number: 5,619,509
[45] Date of Patent: Apr. 8, 1997

[54] APPARATUS AND METHODS FOR TESTING TRANSMISSION EQUIPMENT AND A SELF-TEST METHOD

[75] Inventors: Akira Maruyama; Koji Aihara, both of Kawasaki, Japan

[73] Assignee: Fujitsu, Limited, Kanagawa, Japan

[21] Appl. No.: 400,911

[22] Filed: Mar. 8, 1995

[30] Foreign Application Priority Data

Mar. 18, 1994 [JP] Japan ................................. 6-049489

[51] Int. Cl.$^6$ ..................................................... G06F 11/00
[52] U.S. Cl. ......................... 371/5.4; 371/47.1; 371/5.1; 375/357
[58] Field of Search ............................... 371/5.4, 5.1, 27, 371/42, 46, 47.1, 61, 62; 370/14, 15, 53, 100.1; 395/550; 380/48; 375/357, 359, 362

[56] References Cited

U.S. PATENT DOCUMENTS

| | | | |
|---|---|---|---|
| 4,754,457 | 6/1988 | Bright et al. | 371/47 |
| 4,827,514 | 5/1989 | Ziolko et al. | 380/48 |
| 5,345,583 | 9/1994 | Davis | 371/62 |
| 5,430,746 | 7/1995 | Renz | 371/5.4 |

FOREIGN PATENT DOCUMENTS 4-127755  4/1992  Japan.

*Primary Examiner*—Robert W. Beausoliel, Jr.
*Assistant Examiner*—Phung My Chung

[57] ABSTRACT

A transmission test apparatus having a system-clock redundancy system for testing a transmission path is proposed. In the transmission test apparatus, a clock switching unit selects a proper one from a plurality of system clocks in response to a clock selection signal and supplies a selected system clock. A test-signal check unit performs a synchronization operation in which a first test pattern generated based on the selected system clock is synchronized with a test signal coming through the transmission path and compares the first test pattern with the test signal. A synchronization detection unit detects the synchronization between the first test pattern and the test signal by examining the comparison result of the test-signal check unit to produce a synchronization detection signal. An error counter performs a counting operation in which a number of unidentified bits is counted as error bits after receiving the synchronization detection signal. And, an initializing unit initializes, in response to the clock selection signal, the synchronizing operation in the test-signal check unit and the counting operation in the error counter.

8 Claims, 13 Drawing Sheets

FIG. 2 PRIOR ART

| TEST TYPE (s1) | CONTROL SIGNAL FOR ERROR COUNTER | SYNCHRONIZATION DETECTION SIGNAL (s2) |
|---|---|---|
| SELF-TEST (s1=0) | RESET-OFF (1) | SYNCHRONOUS STATE (s2=0) |
| NORMAL TEST (s1=1) | RESET-ON (0) | ASYNCHRONOUS STATE (s2=1) |

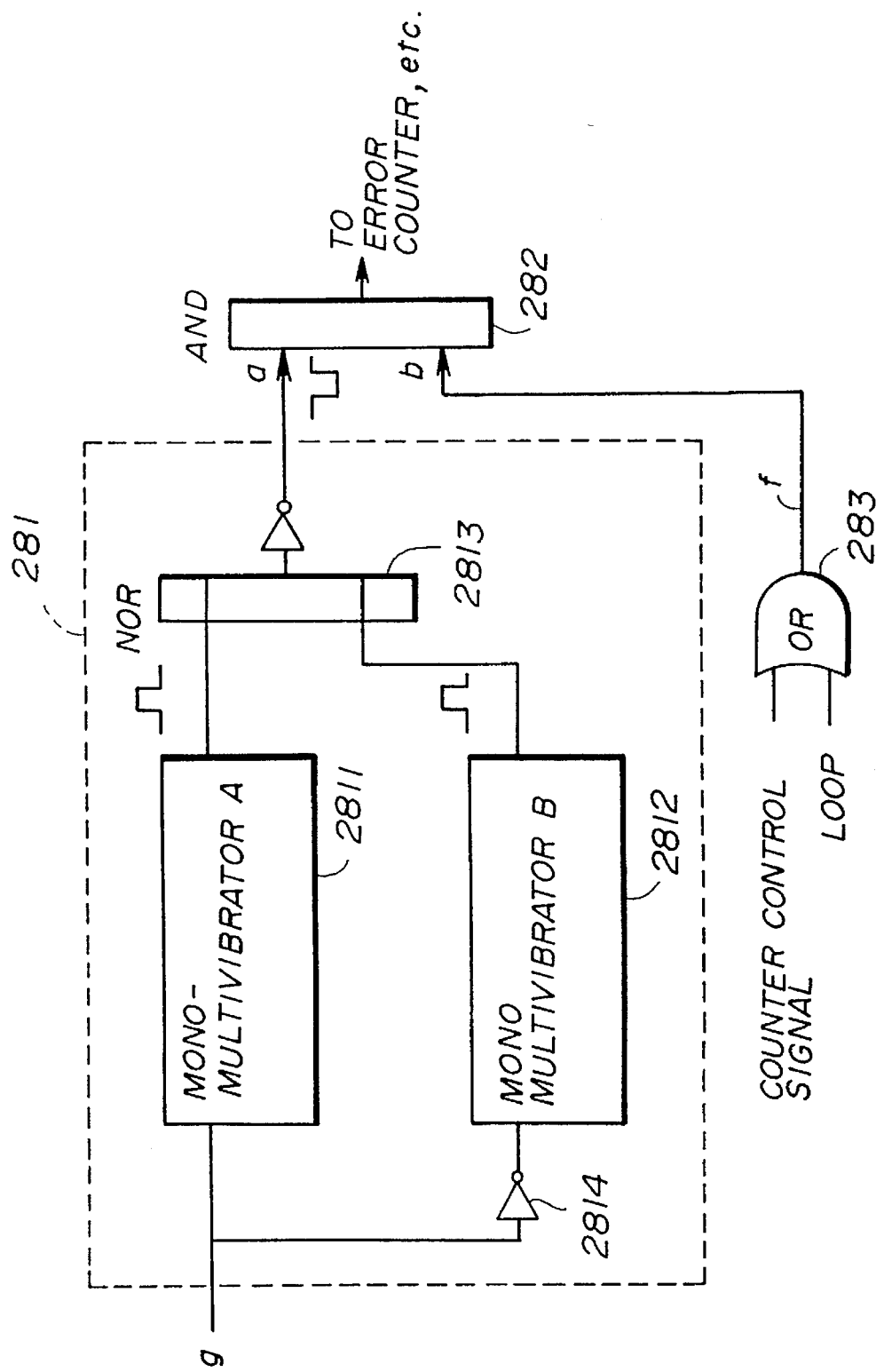

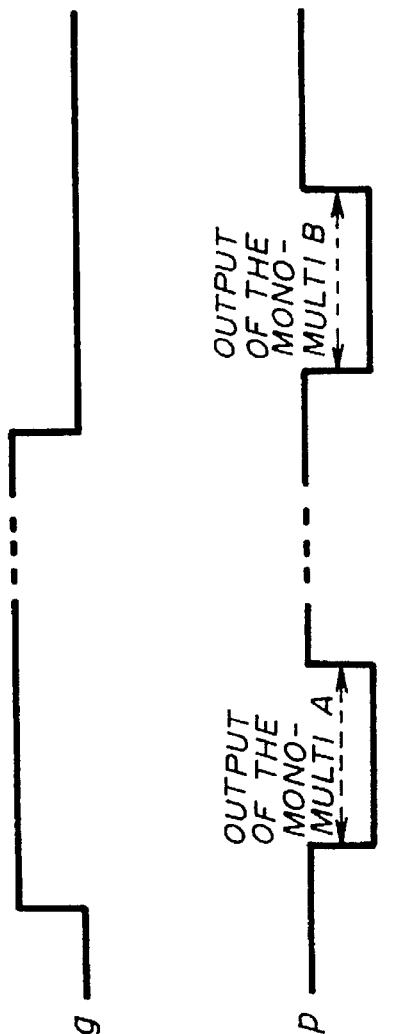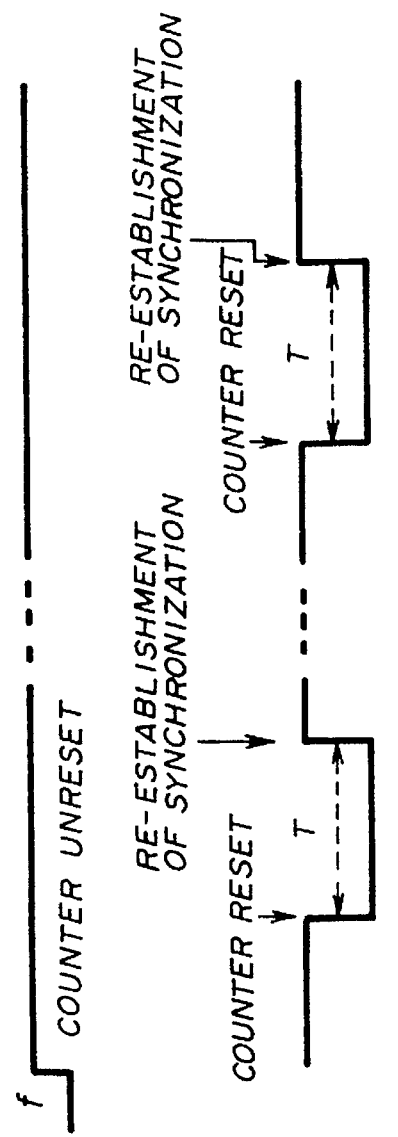

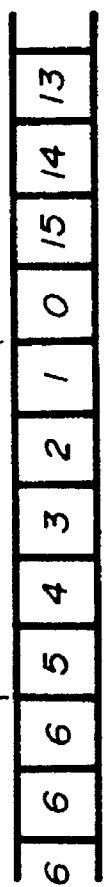
FIG.10A LOAD SIGNAL
FIG.10B CLK
FIG.10C COUNTER ADDRESS
FIG.10D OUTPUT OF DECODER

APPARATUS AND METHODS FOR TESTING TRANSMISSION EQUIPMENT AND A SELF-TEST METHOD

BACKGROUND OF THE INVENTION

1. Field of the Invention

The present invention generally relates to apparatus and methods for testing transmission equipment and a self-test method and more particularly, to apparatus and methods for testing any paths inside transmission equipment and testing paths between the transmission equipment and other transmission equipment, and a self-test method for testing the apparatus mentioned above.

In further detail, this invention concerns apparatus and methods for supervising inside the transmission equipment, which include a function for immediately determining a fault point when trouble occurs in a circuit inside the equipment itself, and also a function for the apparatus supervising itself when no supervision of the transmission equipment is carried out.

Generally, in developing the transmission equipment, previous tests of the transmission equipment are carried out before the transmission equipment is in service. And after service begins, there is a need for determining fault points in troubled equipment, testing the transmission paths inside the equipment itself by means of a self-test apparatus located inside the equipment, and testing the transmission paths between equipment.

2. Description of the Prior Art

FIG. 1 shows a configuration of a conventional test circuit. This circuit comprises a test-pattern generation circuit 100 and a test-pattern check circuit 200.

This test-pattern check circuit 200 includes a first signal selection circuit 210, a second signal selection circuit 221, a reference-pattern generation circuit 224, an exclusive-or circuit 223, a synchronization detection circuit 230, an error counter 240, and a system-clock switching circuit 250. The test-pattern generation circuit 100 has the same configuration as the reference-pattern generation circuit 224, which is configured with an n-stage flip-flop circuit. Each of the test-pattern generation circuit 100 and the reference-pattern generation circuit 224 generates a pseudo-random noise (PN) pattern according to a clock signal supplied through the system-clock switching circuit 250 in the test-pattern check circuit 200. However, in the reference-pattern generation circuit 224, a feedback signal line which is a part of the PN generation mechanism is shown as "signal h", while in the test-pattern generation circuit 100, the feedback signal line is included inside the block 100 and is not illustrated. Therefore, in the reference-pattern generation circuit 224, the second signal selection circuit 221 is inserted in the feedback loop of the PN generation circuit.

The exclusive-or circuit 223 compares a PN pattern in a drop signal z coming from transmission equipment with the reference PN pattern from the reference-pattern generation circuit 224. However, when the self-test is carried out, the exclusive-or circuit 223 compares the PN pattern generated in the test-pattern generation circuit 100 with the reference PN pattern from the reference-pattern generation circuit 224, and determines whether the PN pattern from the test-pattern generation circuit 100 is correct or not. Namely, when the signal pattern coming from the test-pattern generation circuit 100 is identified with the signal pattern coming from the reference-pattern generation circuit 224, the test circuit is recognized as being in a normal condition, and when not being thus identified, the test circuit is recognized as being in a troubled condition in which any fault may be occurring. For example, in the exclusive-or circuit 223, when both the input signal patterns are identical, the circuit supplies a pattern "00000000", whereas when the input signal patterns are not identical, the circuit supplies, for example, a pattern "011100101" including error bits "1". The output of the exclusive-or circuit 223 is applied to the synchronization detection circuit 230. In the synchronization detection circuit 230, the synchronization means that a frame format (for example, 511 bits for 9 stages) repeated on the PN pattern from the test-pattern generation circuit 100 or the transmission equipment is synchronized to that repeated on the PN pattern from the reference-pattern generation circuit 224. Therefore, if a given number of bits "0" is sequentially accepted from the exclusive-or circuit 223, it is decided that synchronization is established. On the other hand, if the sequential bit pattern of "0" for a given number is not obtained, it is decided that the two patterns are out of synchronization.

The first signal selection circuit 210 selects a signal y for the self-test, coupled to a port a, or a drop signal z coupled to a port b, according to a selection signal s1. In the second signal selection circuit 221, if a synchronization detection signal s2 indicates an asynchronous state of the two patterns into the exclusive-or circuit 223, the signal from the first signal selection circuit 210, coupled to a port b, is selected. The selected signal is sent to a delay circuit 222 where the delay time corresponds to that of the reference-pattern generation circuit 224, and is also sent to the reference-pattern generation circuit 224 for setting initial data for the PN generation. And once the synchronization detection signal s2 indicates a synchronous state, a signal h from the reference-pattern generation circuit 224, coupled to a port a, is selected to supply the PN pattern synchronizing with the output of the delay circuit 222 at least the initial some bits. Then, the actual transmission test or self test starts.

In the error counter 240, during a time that the synchronization detection circuit 230 recognizes that synchronization is being established, namely during the transmission test or self test, a synchronous-state signal m is applied from the synchronization detection circuit 230 to the error counter 240, and a number of errors existing in signal ER produced from the exclusive-or circuit 223 is counted.

Next, a description will be given of the operating process of the test circuit shown in FIG. 1.

First, a description will be given of the selection signal used in the test circuit, referenced in FIG. 2. For the case of the self test, the selection signal s1 of the test type is set to "0", while for the case of the normal test, s1 is set to "1". A counter control signal, designated "d", controls a reset-on/off of the count operation of the error counter 240, where the control signal is set to "1" for the reset-off, and is set to "0" for the reset-on. In regard to the synchronization detection signal s2 from the synchronization detection circuit 230, when the synchronous state is determined by the synchronization detection circuit 230, the s2 is set to "0", whereas when the asynchronous state is determined, the s2 is set to "1".

The operation of the conventional test circuit shown in FIG. 1 will be described as follows. FIG. 3 shows a flowchart in relation to the operation of the conventional test circuit.

If the normal test which tests the transmission equipment is selected (step 100), the drop signal z from the transmission equipment is selected in the first signal selection circuit 210 by the selection signal s1 of "1" (step 101), and subsequently the error counter 240 is reset-off by the counter control signal (step 102). Next, the selected drop signal z is applied to the second signal selection circuit 221 and to the delay circuit 222. In the second signal selection circuit 221, first the drop signal z from the first signal selection circuit 210 is selected to send its signal to the reference-pattern generation circuit 224 (step 103). In the reference-pattern generation circuit 224, the drop signal z is sequentially shifted through the n stages of flip-flops which construct the PN generation circuit, while the drop signal z into the delay circuit 222 is also sequentially shifted through n stages of flip-flops which construct the delay circuit having the same delay time as that of the reference-pattern generation circuit 224. Therefore, the output of the reference-pattern generation circuit 224 may be synchronized to the output of the delay circuit 222, and this synchronization may be detected in the synchronization detection circuit 230 through the exclusive-or circuit 223 (step 104 and step 105).

At this time, in the reference-pattern generation circuit 224, each value of the n stages of flip-flops may be the initial value of the PN generation circuit at the time when the second signal selection circuit 221 selects the port a to establish the loop of the PN generation. When the synchronization of the two drop signals from the different paths is detected in the synchronization detection circuit 230, the synchronization detection circuit 230 supplies the synchronization detection signal s2 which indicates, in this case, the synchronous state to the second signal selection circuit 221. Therefore, after the second signal selection circuit 221 selects the port a to establish the PN generation loop in response to the synchronization detection signal s2 (step 106), the drop signal z from the delay circuit 222 is compared with the PN pattern from the reference-pattern generation circuit 224, in which the two signals are in a synchronous state during as least the initial some bits. In this way, the transmission test of the drop signal z through the transmission equipment starts to be carried out by comparing the signal z with the PN pattern generated in the test-pattern check circuit 200.

During the test, the comparison result is applied not only to the synchronization detection circuit 230 as the signal c but also to the error counter 240 as the signal ER. And, at the same time when the synchronization of the two signals into the exclusive-or circuit 223 is detected, the synchronous state signal m which may be the synchronization detection signal is applied to the error counter 240 to enable the counter to begin operation. The error counter 240 then starts to count the error bits existing in the signal ER (step 107). In the flowchart shown in FIG. 3, after the count operation (the step 107), the step 104 is returned to through step 108 and step 109 after each bit operation. If there is a large number of errors in the drop signal z, the error counter 240 overflows (YES of the step 108), and subsequently sends an overflow signal e to a display device 290. In the display device 290, the occurrence of the error state is displayed (step 111).

When the test is finished by termination of the error count (YES of the step 109), the error counter control signal is switched from "1" to "0" (step 110) to reset the error counter 240, and subsequently, the operation proceeds to the self-test procedure.

Next, the operation of the self test in the test circuit will be discussed in the following. The operation of the self test is almost the same as that of the normal test. First, the synchronization between the PN pattern from the test-pattern generation circuit 100 and the PN pattern to be generated in the reference-pattern generation circuit 224 is established. Next, the two PN patterns are compared.

For the self test, the selection signal s1 of "0", which indicates the self test, is applied to the first signal selection circuit 210 in the test-pattern check circuit 200 (step 201). Therefore, in the first signal selection circuit 210, the PN pattern y from the test-pattern generation circuit 100, coupled to the port a, is selected and is applied to the port b of the second signal selection circuit 221 and the exclusive-or circuit 223. At first, the two signals applied to the exclusive-or circuit 223, namely the signal from the reference-pattern generation circuit 224 and the PN pattern coming from the test-pattern generation circuit 100, are not in a synchronous state. Therefore, the synchronization detection circuit 230 produces the synchronization detection signal s2 of "1" so as to select the PN pattern coupled to the port b in the second signal selection circuit 221 (step 203). Thus, the PN pattern coming from the test-pattern generation circuit 100 passes into the reference-pattern generation circuit 224 and sets the initial values of the PN pattern to be generated in the reference-pattern generation circuit 224.

When the PN pattern from the first signal selection circuit 210 and the PN pattern through the reference-pattern generation circuit 224 are in the synchronous state, the synchronization detection circuit 230 produces the synchronization detection signal s2 of "0" (step 205) so as to select the port a of the second signal selection circuit 221 (step 206). In the reference-pattern generation circuit 224, the PN pattern is generated by the feedback loop being formed, and is applied to the exclusive-or circuit 223. In this way, in the exclusive-or circuit 223, the PN pattern selected in the first signal selection circuit 210 is compared with the PN pattern generated in the reference-pattern generation circuit 224.

At this time, the exclusive-or circuit 223 carries out the exclusive-or logical operation with the above two signal patterns. The result of the exclusive-or logical operation is applied not only to the synchronization detection circuit 230 as the signal c but also to the error counter 240 as the signal ER. In the synchronization detection circuit 230, when the synchronization is detected, the synchronous state signal m is produced to the error counter 240 to enable the count operation. Therefore, in response to the signal m which indicates the synchronous state, the error counter 240 starts to count error bits existing in the signal ER (step 207). And procedures from step 204 to step 209 are repeated until the test is finished as long as the synchronization is continued.

If any fault occurs in the test-pattern generation circuit 100 or the reference-pattern generation circuit 224, the signal ER from the exclusive-or circuit 223 may include errors which are to be counted in the error counter 240. When the count number of the error counter 240 exceeds a given number of errors, the over-flow signal e representing the count number is sent to the display device 290 (YES of step 208) which displays the error conditions according to the count number of the over-flow signal e (step 211). This display indicates that trouble is occurring in the test circuit.

When the test is finished (YES of the step 209), the error counter control signal is switched from "1" to "0" (step 210) to reset the error counter 240.

Furthermore, this test circuit is constructed using a redundancy system clock, in which a system-clock selector 250 may select either a clock of line 0 or a clock of line 1. A clock selection signal g is applied to the system-clock selector 250 from an external device (not shown) so as to supply a proper clock to the test-pattern generation circuit 100 and the reference-pattern generation circuit 224. These circuits are respectively operative by synchronizing to the system clock.

In the conventional construction mentioned above, if during the test any trouble occurs in the clock which is currently being selected as the system clock, by the order of the selection signal g the system-clock selector 250 is controlled to switch to the other proper clock as the system clock. However, in general it is hard to carry out the switching without any turbulence of the clock, so that in the switching operation the system clock from the system-clock selector 250 is imposed to have the switching turbulence. In addition, the two clock sources coupled to the system-clock selector 250 are independently operative and the phases of the clocks are not in synchronization with each other. Further, the switching timing in the system-clock selector 250 is not also synchronized to the two clocks. Therefore, if the switching timing and a falling edge or a rising edge of each of two signals are almost close each other, the selected system clock is imposed to have a non-uniform period. However, in such a test apparatus, a normal clock and an inverted clock are generally used. Therefore, the non-uniform period in the clock causes the clocking timing to be shifted. The turbulence and the non-uniform period cause the incomplete clock pulses, by which all circuits receiving such a system clock may not be simultaneously clocked. Therefore, the switching turbulence and the non-uniform period may cause asynchronous clocking of all of circuits included in the test circuit. And thus, the synchronization between the two signals into the exclusive-or circuit 223 may be out, the above causing the error counter to overflow, in which case an alarm for the fault of the transmission equipment is produced. Therefore, false information indicating transmission equipment trouble may be displayed although no trouble has occurred in the transmission equipment. There is thus the problem that the switching of the system clock in the system-clock redundancy system interferes with a stable transmission test.

SUMMARY OF THE INVENTION

It is an object of this invention to provide apparatus and methods for testing transmission equipment and a self-test method in which the system clock switching in the system-clock redundancy system does not effect a stable transmission test, in which the disadvantages described above are eliminated.

The object described above is achieved by a transmission test apparatus having a system-clock redundancy system for testing a transmission path, the transmission test apparatus comprising: a clock switching means for selecting a proper one from a plurality of system clocks in response to a clock selection signal and supplying a selected system clock; test-signal check means for performing a synchronization operation in which a first test pattern generated based on the selected system clock in the test-signal check means is synchronized with a test signal coming through the transmission path, which test signal has been formed with the same pattern as the first test pattern, and for comparing the first test pattern with the test signal; synchronization detection means for detecting a synchronization between the first test pattern and the test signal by examining the comparison result of the test-signal check means and producing a synchronization detection signal which indicates a synchronous state when detecting the synchronization; an error counter performing a counting operation in which a number of error bits existing in the comparison result of the test-signal check means is counted after receiving the synchronization detection signal from the synchronization detection means; and initializing means for generating an initializing signal in response to the clock selection signal to initialize the synchronizing operation in the test-signal check means and the counting operation in the error counter.

The object described above is also achieved by the transmission test apparatus further comprising test-pattern generation means for generating a second test pattern which is formed with the same pattern as the first test pattern based on the selected system clock; and first signal selection means for being capable of supplying the second test pattern coming from the test-pattern generation means, instead of the test signal coming through the transmission path, to the test-signal check means, wherein a self-test of the transmission test apparatus is carried out for selection of the second test pattern, whereas a transmission test of the transmission path is carried out for selection of the test signal.

The object described above is further achieved by the transmission test apparatus, wherein: in response to the initializing signal the synchronization detection means initializes the synchronization detecting operation and controls the test-signal check means to carry out the synchronizing operation again by a deactivated synchronization detection signal which indicates an asynchronous state; and the error counter, after being reset by the initializing signal, restarts the counting operation in response to the synchronization detection signal generated again in the synchronization detection means.

In addition, the object described above is achieved by the transmission test apparatus, wherein the test-signal check means comprises: a PN pattern generator producing a PN pattern by forming a PN pattern generation loop; and a second signal selection means, included in the PN pattern generation loop in the PN pattern generator, for supplying either a feedback signal of the PN pattern generation loop or a selected signal in the first signal selection means to the PN pattern generator by the synchronization detection signal, wherein the synchronizing operation in the test-signal check means is carried out such that, before receiving the synchronization detection signal which indicates the synchronous state, the second signal selection means selects the selected signal in the first signal selection means, and after receiving the synchronization detection signal the second signal selection means selects the feedback signal to close the PN pattern generation loop and generate the PN pattern as the first test pattern, in which the PN pattern is synchronized to the selected signal in the first signal selection means.

The object described above is also achieved by a transmission test method for testing a transmission path, the transmission test method comprising the steps of: (a) generating a second test pattern based on a system clock in a test-pattern generation circuit, and supplying the second test pattern to a test-signal check circuit through the transmission path to be tested; (b) generating a first test pattern which is synchronized to the second test pattern, based on the system clock in the test-signal check circuit; (c) comparing the first test pattern with the second test pattern in the test-signal check circuit; (d) counting a number of unidentified bits, which indicate error bits, in the comparison result of the test-signal check circuit by a counter; and (e) establishing again, when the system clock is switched to another system clock by a selection signal, the synchronization between the first test pattern and the second test pattern in response to the selection signal, and resetting the counter, and after synchronization establishment restarting the counting operation of the counter.

According to the apparatus and methods for testing transmission equipment and the self test of the transmission test apparatus, in the transmission test apparatus having the system-clock redundancy system, when the system clock is switched by the selection signal, the selection signal controls the synchronization detection circuit to establishing synchronization again between the pattern to be tested (the test signal through the transmission path or the second test pattern directly coming from the test-pattern generation means) and the reference second test pattern generated in the test-signal check means, and simultaneously the selection signal also resets the error counter. After establishment of the synchronization the count operation of the error counter is started.

In this way, when a loss of synchronization occurs due to switching the system clock, the error counter is reset before the error counter overflows due to the loss of the synchronization. Therefore, even if the system clock is switched in the system-clock redundancy system, a report, that any trouble has occurred in the transmission equipment or the transmission test apparatus because of an overflow in the error counter, may not be represented. And thus, in this transmission test apparatus according to the invention, the system-clock switching in the system-clock redundancy system does not effect the stable transmission test.

Other objects and further features of the present invention will be apparent from the following detailed description when read in conjunction with the accompanying drawings.

BRIEF DESCRIPTION OF THE DRAWINGS

FIG. 2 shows a table for explaining parameters of a selection signal and a counter control signal;

FIG. 7 shows a block diagram for explaining one example of an initializing circuit of the first embodiment;

FIG. 8 shows time charts for explaining an operation of the initializing circuit;

FIG. 10 shows time charts for explaining an operation of the initializing circuit shown in FIG. 9;

DESCRIPTION OF THE PREFERRED EMBODIMENTS

Figure 4:
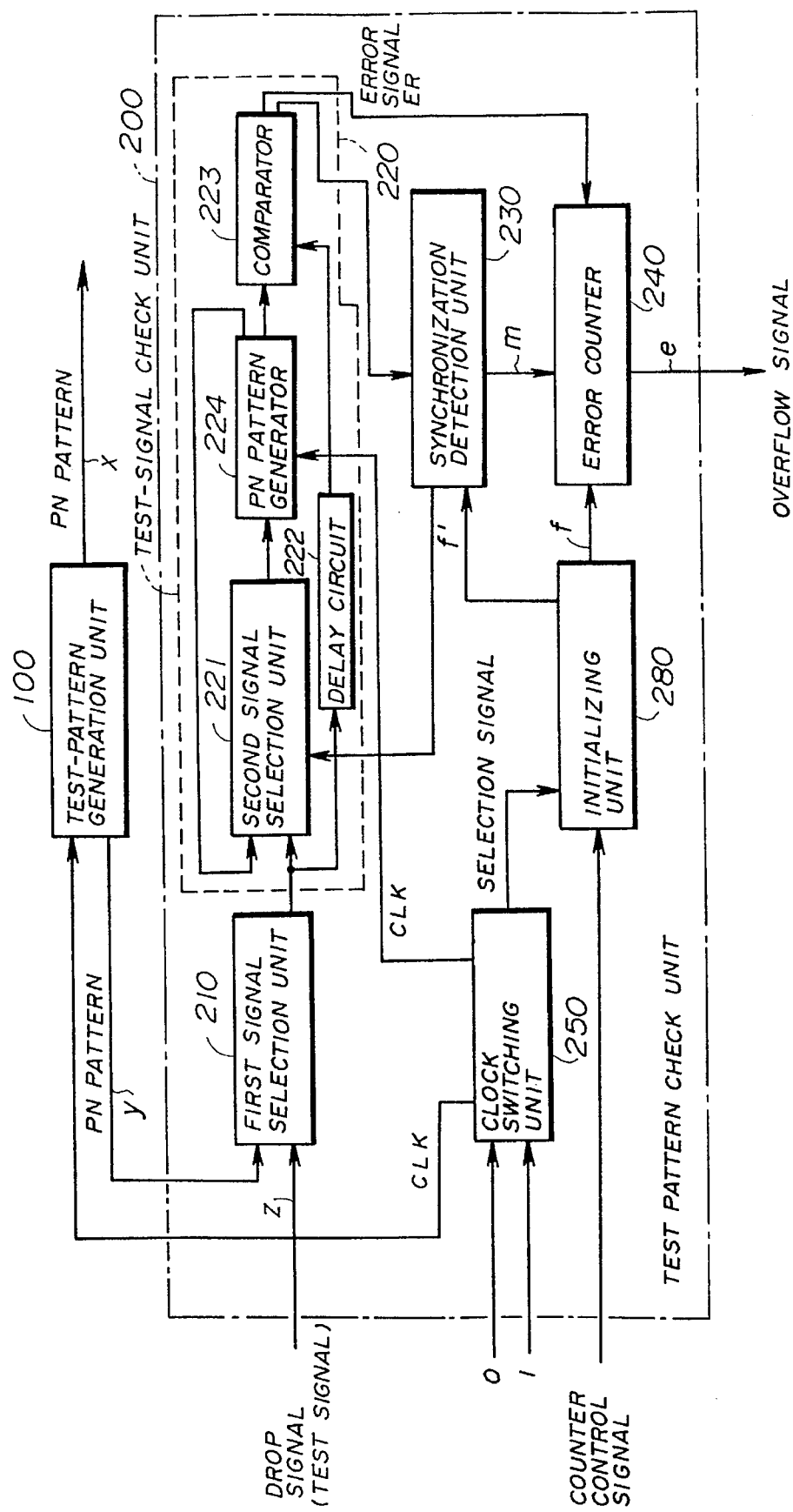
FIG. 4 shows a block diagram for explaining a principle configuration of a transmission test apparatus according to the present invention.

First, a principle of an operation of transmission test apparatus according to the present invention will be described by referring to FIG. 4. FIG. 4 shows a principle configuration of the transmission test apparatus. This transmission apparatus comprises a test-pattern generation unit 100 which generates a test-pattern such as PN patterns y, x and a test-pattern check unit 200 which compares a reference PN pattern generated inside with a test signal such as a drop signal z carried through a transmission path inside transmission equipment or the PN pattern y. It is noted that the drop signal z has also been formed with the same pattern as the PN pattern.

The test-pattern check unit 200 comprises a test-signal check unit 220, a first signal selection unit 210, synchronization detection unit 230, an error counter 240, a clock switching unit 250, and an initializing unit 280. The test-signal check unit 220 includes a second signal selection unit 221, a delay circuit 222, a comparator 223, and a PN pattern generator 224.

When the first signal selection unit 210 selects the PN pattern y from the test-pattern generation unit 100, a self test of this transmission test apparatus is carried out such that the PN pattern y is compared with the reference PN pattern generated in the test-signal check unit 220. When the first signal selection unit 210 selects the drop signal z carried through the transmission path, a transmission test of the transmission equipment is carried out such that the drop signal z is compared with the reference PN pattern.

The PN pattern is constructed by a fixed pattern being repeated. Therefore, for comparing the two PN patterns, it is necessary to synchronize two PN patterns by the fixed pattern. This establishment of the synchronization may be carried out by using the second signal selection unit 221 and a delay circuit 222. A description will be given of a case that the drop signal z is selected in the first signal selection unit 210. A description of the case in which the PN pattern y is selected is omitted because of the procedure being the same.

First, the second signal selection unit 221 selects the drop signal z to supply to the PN pattern generator 224. The PN pattern generator is opened by the second signal selection unit 221, and thus is operative only as a delay circuit such as the delay circuit 222. The drop signal z is also passed through the delay circuit 222 which has the same delay as that of the PN pattern generator 224. The drop signal passed through the PN pattern generator 224 then is compared with the drop signal through the delay circuit 222, and the comparison result is supplied to the synchronization detection circuit 230 to be examined. In the synchronization detection circuit 230, the synchronization between the two drop signals may properly be detected in a short period of time. Subsequently, the synchronization detection unit produces a synchronization detection signal which indicates the synchronous state to the second signal selection unit 221 to select a feedback signal of the PN generation loop. The PN generator starts to generate the reference PN pattern, the initial pattern of which is identical to the pattern in the delay circuit 222. In this way, the reference PN pattern which is synchronized to the drop signal z from the delay circuit 222 may be obtained.

After that, the drop signal z is compared with the reference PN pattern generated in the test-signal check unit 220. When the synchronization is established, the synchronization detection signal which indicates the synchronous state is also applied to the error counter 240 to enable a count operation. The error counter 240 then starts to count error bits which are unidentified bits existing in the comparison result of the test-signal check unit 220. If a large number of errors occurs due to any trouble in the transmission equipment, the error counter 240 may overflow, in which case an overflow signal is sent to display that trouble occurred in the transmission equipment.

This transmission test apparatus adopts a system-clock redundancy system which is capable of selecting a proper system clock from two system clocks according to a condition of the system clocks. However, when the system clock is switched, a turbulence of the system clock due to the switching can cause a loss of the synchronization. Therefore, in this configuration, in response to a selection signal which indicates the system-clock switching, the initializing unit 280 initializes the synchronization detection unit 230 and the error counter 240 before the error counter overflows. When the synchronization detection unit 230 is initialized, this unit controls the second signal selection unit 221 to select the drop signal z again. Thus, the synchronization establishment operation is carried out again. On the other hand, when the error counter 240 is initialized, this counter is reset. And receiving the synchronization detection signal from the synchronization detection unit 230, enables the error counter 240 to count again.

In this way, even if the system clock is switched in the redundancy system, a subsequent transmission test may be continued without the overflow of the error counter. Thus, this configuration according to the invention enables a stable transmission test.

Next, the invention will be further explained by way of example, with reference to the accompanying drawings.

Figure 5:
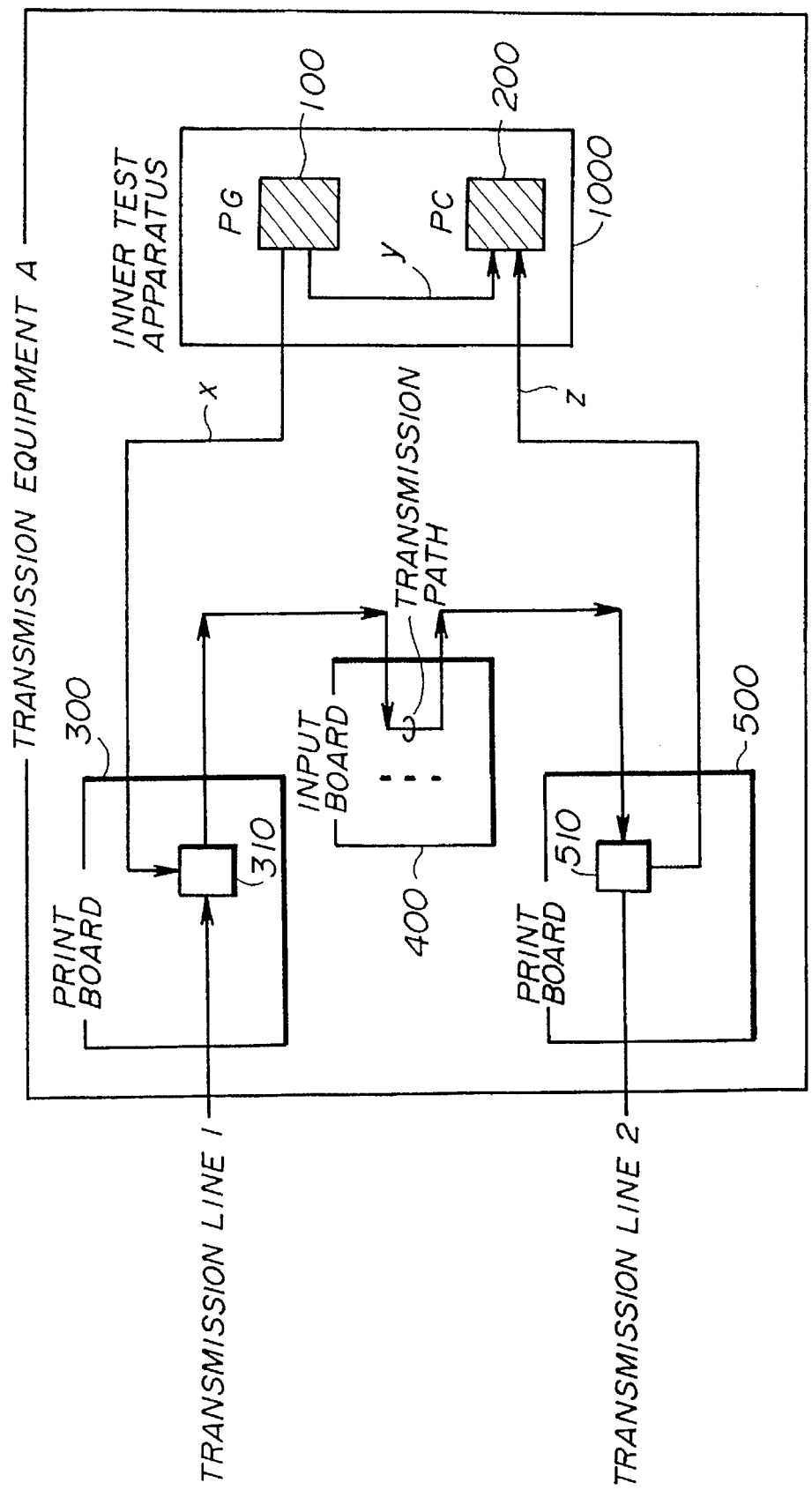
FIG. 5 shows a block diagram of a transmission test system according to the present invention.

FIG. 5 shows a block diagram for explaining a transmission test system according to the present invention. As shown in FIG. 5, transmission equipment A is constructed with print boards 300, 400, 500 and an inner test apparatus 1000. Each of the print boards 300, 500 includes a transmission path interface and a test signal interface, and the print board 400 includes an inner signal processing board. The inner test apparatus 1000 comprises the test-pattern generation circuit 100 and the test-pattern check circuit 200. A signal selector 310 selects either an input signal from a transmission path 1 or the PN pattern coming from the test-pattern generation circuit 100 in the inner test apparatus 1000. For normal operation, the input signal from the transmission path 1 is selected, and for the transmission test inside the transmission equipment, the PN pattern is selected. The print board 300 sends the selected signal to the print board 400. In the print board 400, the input signal is processed and supplied to the print board 500. In the print board 500, if the input signal is a main signal, the main signal is sent to a transmission path 2 by a signal selector 510, whereas if the input signal is a test pattern such as the PN pattern for the transmission test, the test pattern as a drop signal is sent to the test-pattern check circuit 200 in the inner test apparatus 1000.

Figure 6:
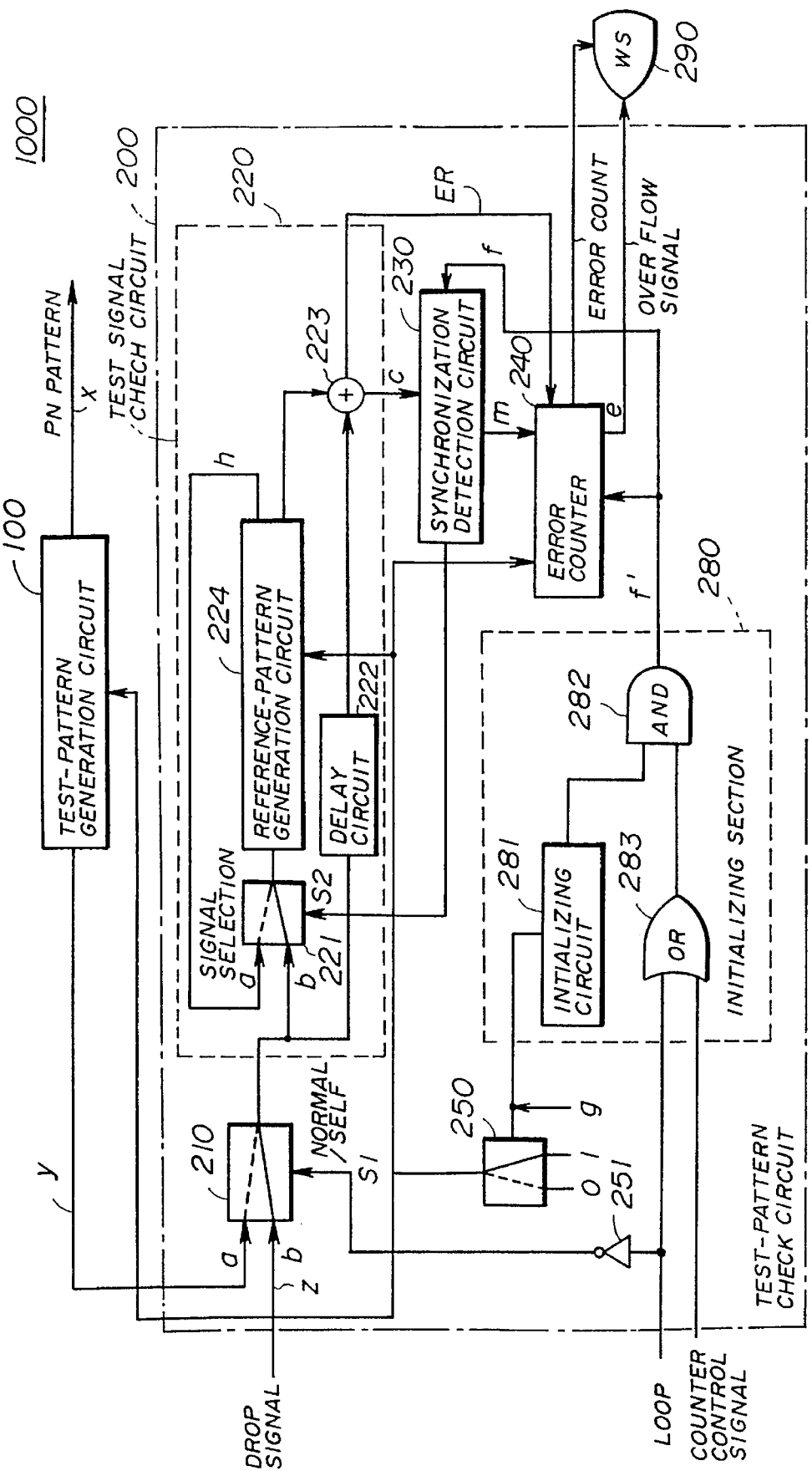
FIG. 6 shows a block diagram for explaining a configuration of a transmission test apparatus of a first embodiment.

Next, a description will be given of a first embodiment of a transmission test apparatus according to the present invention, by referring to FIG. 6. FIG 6 shows a block diagram for explaining a configuration of the transmission test apparatus of the first embodiment. In the drawings, the same reference numerals as that in FIG. 1 have been used to indicate corresponding features, so that their description will be omitted here.

Figure 1:
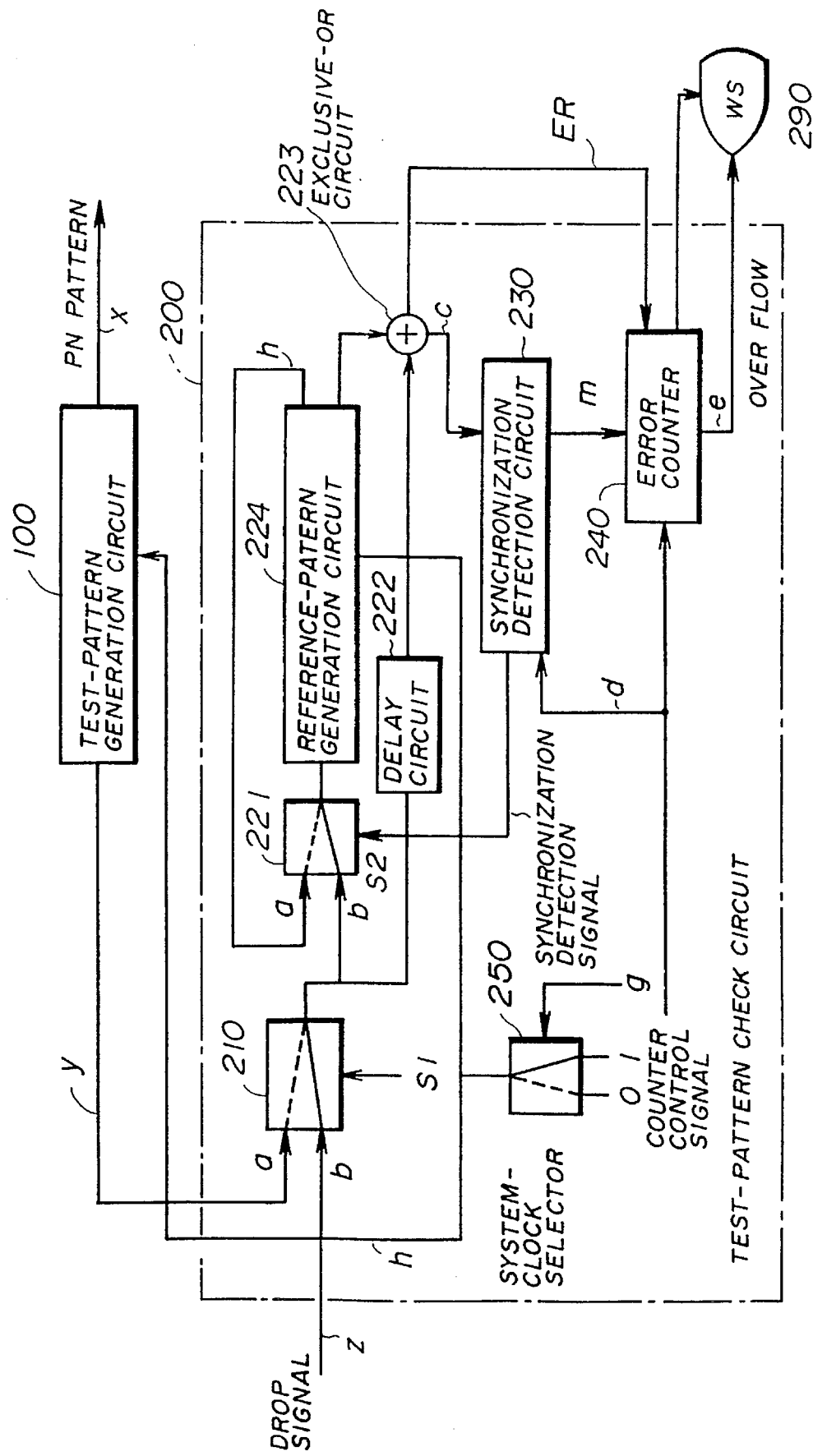
FIG. 1 shows a block diagram for explaining a configuration of a conventional test circuit.

The inner test apparatus 1000 shown in FIG. 6 further includes an initializing section 280 in the test-pattern check circuit 200 not in the test-pattern check circuit 200 shown in FIG. 1. The initializing section 280 consists of an initializing circuit 281, an AND gate 282, and an OR gate 283.

FIG. 7 shows a block diagram for explaining one example of the initializing circuit 281 of the first embodiment. And FIG. 8 shows time charts for explaining an operation of the initializing circuit 281. As shown in FIG. 7, the initializing circuit 281 consists of a mono-multivibrator A 2811, a mono-multivibrator B 2812 with an inverter 2814, and a NOR gate 2813. Each of the mono-multivibrators is capable of producing a pulse with a given period in response to the rising edge of the input signal. When the clock selection signal g such as a signal A shown in FIG. 8 is supplied to the initializing circuit 281, the clock selection signal g is supplied to the mono-multivibrator A 2811, and is also supplied to the mono-multivibrator B 2812 after being inverted in the inverter 2814. Therefore, the mono-multivibrator A 2811 generates a pulse with a given duration of period on the rising edge of the clock selection signal g, and the mono-multivibrator B 2812 generates a pulse with a given duration of period on the falling edge of the clock selection signal g. These pulses are logically summed in the NOR gate 2813, and the output of the NOR gate 2813 as a signal B shown in FIG. 8 is supplied to the AND gate 282. And subsequently, the output of the initializing circuit 281, indicated as the signal B, is supplied to the error counter 240, etc., after being multiplied with a counter control signal as a signal C shown in FIG. 8.

As described above, this initializing circuit 281 can produce the initializing pulse by each transition such as the rising edge and the falling edge of the clock selection signal, so that this circuit is effective for both switching from a system clock 0 to a system clock 1 and from the system clock 1 to the system clock 0.

The output of the AND gate 282 is the initializing signal which is represented as a signal D shown in FIG. 8. This initializing signal is supplied to the error counter 240 and the synchronization detection circuit 230. During a duration of a low level of the initializing signal, the error counter 240 is being reset. And after the duration, the synchronization detection circuit 230 controls the test-signal check circuit 220 to establish the synchronization again. After establishment of the synchronization, the error counter may count error bits again.

In this case, the duration T of the pulse generated in the mono-multivibrator is determined such that the turbulence of the system clock due to the clock switching calms down during the duration. Therefore, after the duration, a stable transmission test unaffected by the turbulence is permitted. Namely, this initializing section 280 enables avoidance of the overflow in the error counter, so that a false alarm in the system-clock switching may be avoided.

Figure 9:
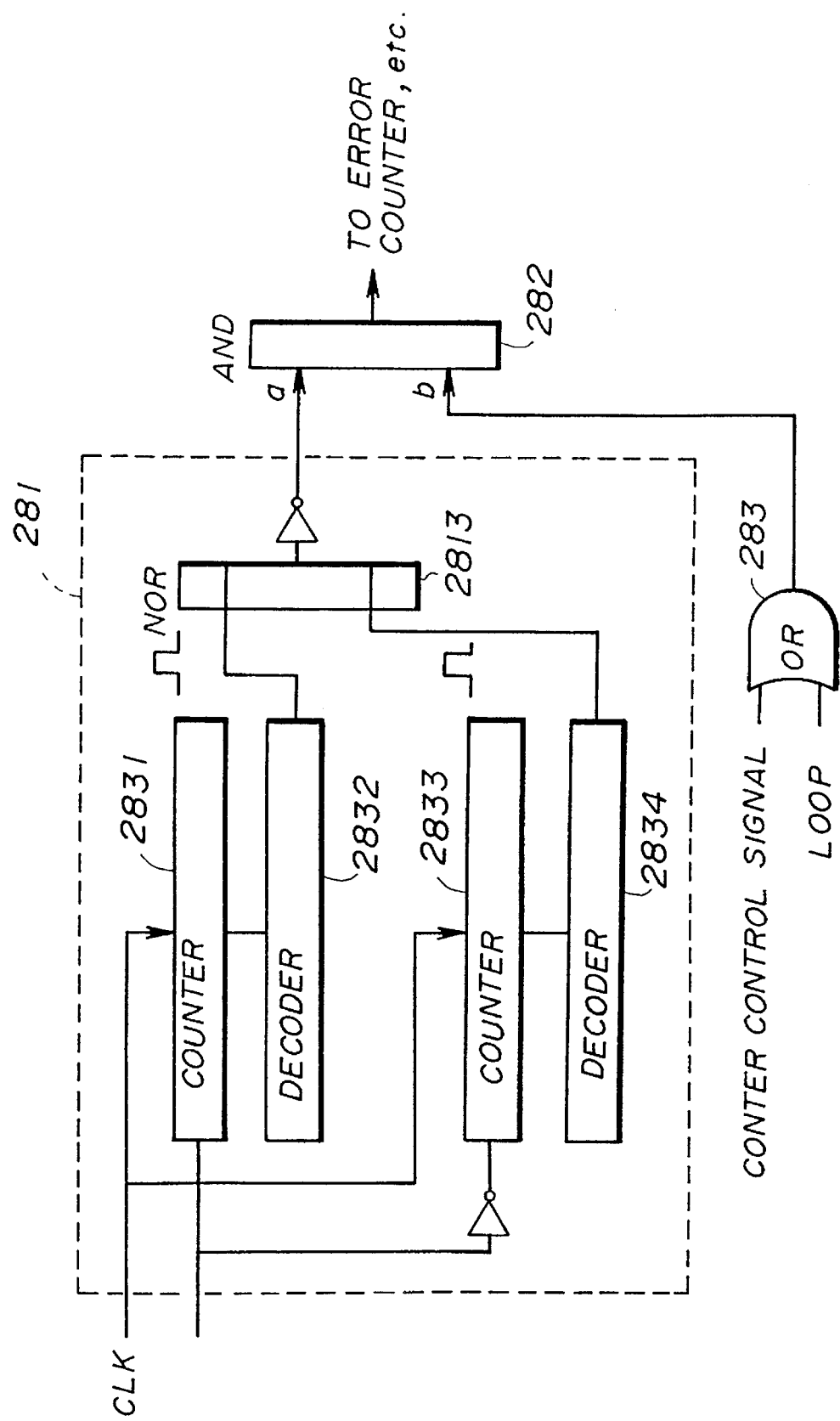
FIG. 9 shows a block diagram of another example of the initializing circuit.

FIG. 9 shows a block diagram of another example of an initializing circuit 281. As shown in FIG. 9, the initializing circuit 281 comprises two counters 2831, 2833, two decoders 2832, 2834, and a NOR gate 2813. And FIG. 10 shows time charts for explaining an operation of the initializing circuit 281 shown in FIG. 9. The clock selection signal is supplied to these counters 2831, 2833 as a load signal. In FIG. 10, an example is shown that each of these counters is a type of 4-bits down counter with a load function and load data of 6 is set to each counter. Therefore, during a low level of the clock selection signal, the counter address of the counter 2831 is set to 6, and after transition to a high level of the clock selection signal the counter 2831 starts to count the clock pulses, and then the counter address is decreased by the number of clock pulses counted. Finally, when the counter address is 0, the counter 2831 produces a carry pulse. The decoder 2832 generates a single pulse of 5-clock-pulses duration by using the load signal and the carry pulse. In the same way, the counter 2833 and the decoder 2834 generates a single pulse of 5-clock-pulses duration on the falling transition of the clock selection signal.

It is noted that there are many methods for generating such pulses by using counters and decoders besides the one shown here. For example, a decoder can monitor an address of a counter, and when the decoder detects the address of 6 a pulse of 5-clock-pulses duration is formed. In this example, a normal counter without the load function is available. Furthermore, by using an up counter with the load function, the initializing circuit is also constructed.

The outputs of the decoders 2832, 2834 are logically summed in the NOR gate 2813. The output of the NOR gate 2813 is sent to the error counter 240 and the synchronization detection circuit 230 after being multiplied with the counter control signal in the AND gate 282. The operations in the error counter 240 and the synchronization detection circuit 230 are the same as the operation using the initializing circuit shown in FIG. 7. In this circuit shown in FIG. 9, the duration of the initializing pulse can be determined by selecting the counter load data and a frequency of the input clock. This duration should be selected so as to be longer than the turbulence duration due to the system clock switching.

Figure 11:
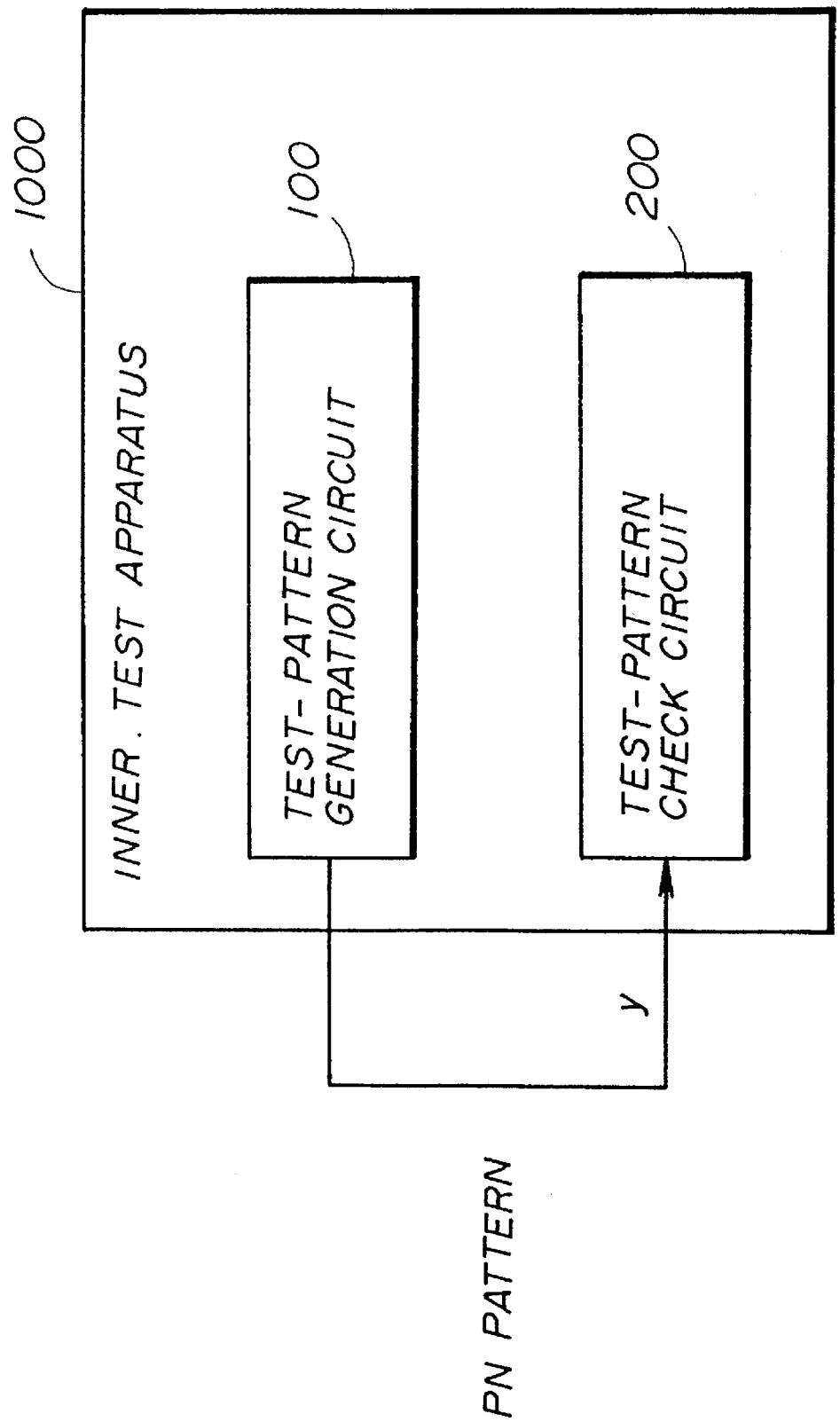
FIG. 11 shows a system configuration for a self test of an inner test apparatus.

Next, a description will be given of an operation of the self test in the transmission test apparatus shown in FIG. 6. FIG. 11 shows a system configuration for the self test of the inner test apparatus 1000. In the self test, the PN pattern y generated in the test-pattern generation circuit 100 is directly supplied to the test-pattern check circuit 200. In the test-pattern check circuit 200, the PN pattern coming from the test-pattern generation circuit 100 is compared with the reference PN pattern generated in the test-pattern check circuit 200. When the two patterns are not identical each other, it is assumed that there is a fault part in the inner test apparatus 1000.

In FIG. 6, the PN pattern y generated in the test-pattern generation circuit 100 is supplied to the first signal selection circuit 210 in the test-pattern check circuit 200. The first signal selection circuit 210 is controlled by the selection signal s1. For the self test, a loop signal of "1" from a selection signal generation section (not shown) is inverted in an inverter 251, and is to be the selection signal s1 of "0". This selection signal s1 of "0" selects the PN pattern coupled to the port a in the first signal selection circuit 210. The selected PN pattern is sent to the second signal selection circuit 221 and to the exclusive-or circuit 223 through the delay circuit 222.

The second signal selection circuit 221 selects either the feedback signal h, coupled to the port a, from the reference pattern generation circuit 224 or the PN pattern from the first signal selection circuit 210 by the selection signal s2. The selection signal s2 is supplied from the synchronization detection circuit 230. In general, the first two signals supplied to the exclusive-or circuit 223 are in an asynchronous state, so that the synchronization detection circuit 230 produces the selection signal s2 of "1" which indicates the asynchronous state. In the second signal selection circuit 221, the selection signal s2 of "1" selects the PN pattern from the first signal selection circuit 210. Namely, the PN pattern from the first signal selection circuit 210 is supplied to the exclusive-or circuit 223 through both, in parallel, the reference pattern generation circuit 224 and the delay circuit 222. Then, the synchronization detection circuit 230 may detect an establishment of synchronization between the outputs of the reference-pattern generation circuit 224 and the delay circuit 222, and subsequently produces the synchronization detection signal which is the selection signal s2 of "0". In response to the synchronization detection signal s2 of "0", the second signal selection circuit 221 selects the feedback signal h from the reference-pattern generation circuit 224 to generate the reference PN pattern. The reference PN pattern may be synchronized to the PN pattern coming from the test-pattern generation circuit 100 through the delay circuit 222.

In the initializing section 280, for the self test, the loop signal of "1" and the counter control signal are supplied to the OR gate 283. However, when the self test is carried out sequentially after the normal transmission test, the counter control signal is maintained to be "0" which has been set in the last step of the normal test procedure. Therefore, the self test may start by the loop signal changing from "0" to "1". These values of the loop signal and the counter control signal are programed in a computer (not shown).

When the system clock is switched, the system-clock selection signal g is applied to the initializing circuit 281, and the initializing signal f' processed in the initializing circuit 281 is sent to the error counter 240 and the synchronization detection circuit 230 through the AND gate 282.

When the error counter 240 receives the initializing signal f' the error count number is reset to 0. The synchronization detection circuit 230 is initialized by the initializing signal f', and controls the test-signal check circuit 220 to establish synchronization again. At this time, the selection signal s2 and the signal m indicate the asynchronous state. Therefore, in the second signal selection circuit 221 the PN pattern from the first signal selection circuit 210 is selected by the selection signal s2, and in the error counter 240 the count operation is disenabled by the signal m.

After establishment of synchronization, by the signal m which indicates the synchronous state, the error counter 240 starts to count error bits existing in the result of comparing the PN pattern from the test-pattern generation circuit 100 with the reference PN pattern generated in the test-signal check circuit 220.

In this way, because a reset of the error counter 240 is carried out before the error counter overflows, in which the overflow is reported as a fault in the transmission equipment, this initializing section 280 enables avoidance of the overflow in the error counter, so that the false alarm in the system-clock switching may be avoided. Therefore, even if the system clock is switched in the redundancy system, a stable self test may be continued.

Figure 12:
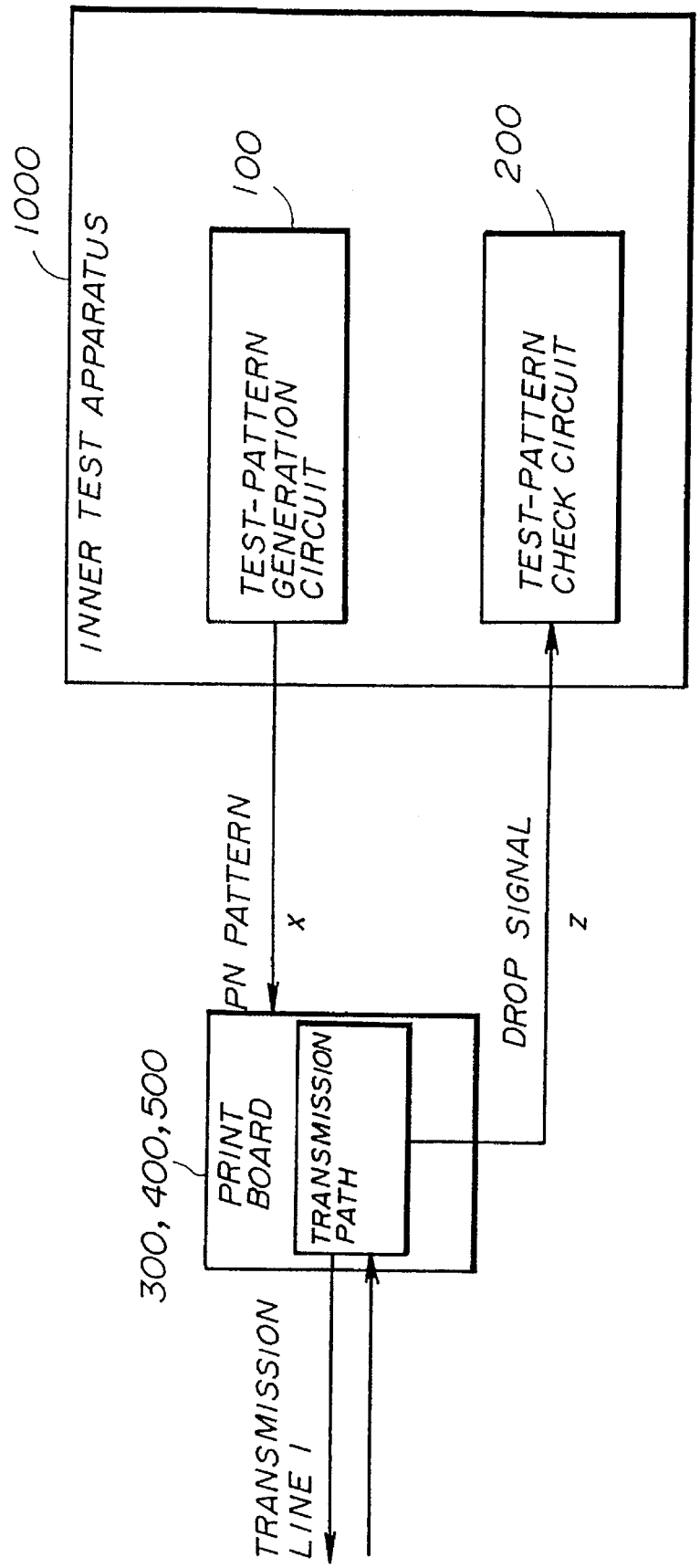
FIG. 12 shows a system configuration for a normal transmission test of the inner test apparatus.

Next, a description will be given of an operation of the normal transmission test for the transmission path. FIG. 12 shows a system configuration for the normal transmission test of the inner test apparatus 1000. For the normal transmission test, the PN pattern y generated in the test-pattern generation circuit 100 is supplied to the print board 400, and is transmitted through the print board 400, and finally is passed as the drop signal z from the print board 500 to the test-pattern check circuit 200. In the test-pattern check circuit 200, the drop signal z is compared with the reference pattern generated in the test-pattern check circuit 200. In this way, it is tested whether there is a fault in the transmission path from the print board 300 to the print board 500.

In FIG. 6, the PN pattern x generated in the test-pattern generation circuit 100 is supplied as an insert signal to the external transmission equipment. For the normal transmission test, the first signal selection circuit 210 selects the drop signal z, coupled to the port b, which is the received PN pattern through the transmission equipment by the selection signal s1. In this case, the selection signal s1 is "1", which is the inverted signal of the loop signal of "0". In the same way as the self test, the selected drop signal z is sent to the second signal selection circuit 221 and to the exclusive-or circuit 223 through the delay circuit 222.

The second signal selection circuit 221 selects either the feedback signal h, coupled to the port a, from the reference pattern generation circuit 224 or the drop signal from the first signal selection circuit 210 by the selection signal s2. The selection signal s2 is supplied from the synchronization detection circuit 230. In general, the first two signals supplying to the exclusive-or circuit 223 are in an asynchronous state, so that the synchronization detection circuit 230 produces the selection signal s2 of "1" which indicates the asynchronous state. In the second signal selection circuit 221, the selection signal s2 of "1" selects the drop signal z from the first signal selection circuit 210. Namely, the drop signal z from the first signal selection circuit 210 is supplied to the exclusive-or circuit 223 through both, in parallel, the reference pattern generation circuit 224 and the delay circuit 222. Then, the synchronization detection circuit 230 may detect the establishment of synchronization between the outputs of the reference-pattern generation circuit 224 and the delay circuit 222, and subsequently produces the synchronization detection signal which corresponds to the selection signal s2 of "0". In response to the synchronization detection signal s2 of "0", the second signal selection circuit 221 selects the feedback signal h from the reference-pattern generation circuit 224 to generate the reference PN pattern. The reference PN pattern may be synchronized to the drop signal coming from the transmission equipment such as the print board 300, 400, 500 through the delay circuit 222.

In the initializing section 280, for the normal transmission test, the loop signal of "0" and the counter control signal are supplied to the OR gate 283. In this case, the normal test may start by the counter control signal changing from "0" to "1".

When the system clock is switched, the system-clock selection signal g is applied to the initializing circuit 281, and the initializing signal f' processed in the initializing circuit 281 is sent to the error counter 240 and the synchronization detection circuit 230 through the AND gate 282.

When the error counter 240 receives the initializing signal f', the error count number is reset to 0. The synchronization detection circuit 230 is initialized by the initializing signal f', and controls the test-signal check circuit 220 to establish synchronization again. In this time, the selection signal s2 and the signal m indicate the asynchronous state. Therefore, in the second signal selection circuit 221 the drop signal z from the first signal selection circuit 210 is selected by the selection signal s2, and in the error counter 240 the count operation is disenabled by the signal m.

After establishment of synchronization, by the signal m which indicates the synchronous state, the error counter 240 starts to count error bits existing in the result of comparing the drop signal from the transmission equipment with the reference PN pattern generated in the test-signal check circuit 220.

In this way, because the reset of the error counter 240 is carried out before the error counter overflows, in which the overflow is reported as a fault in the transmission equipment, the false alarm in the system-clock switching may be avoided. Therefore, even if the system clock is switched in the redundancy system, a stable normal transmission test may be continued.

Figure 13:
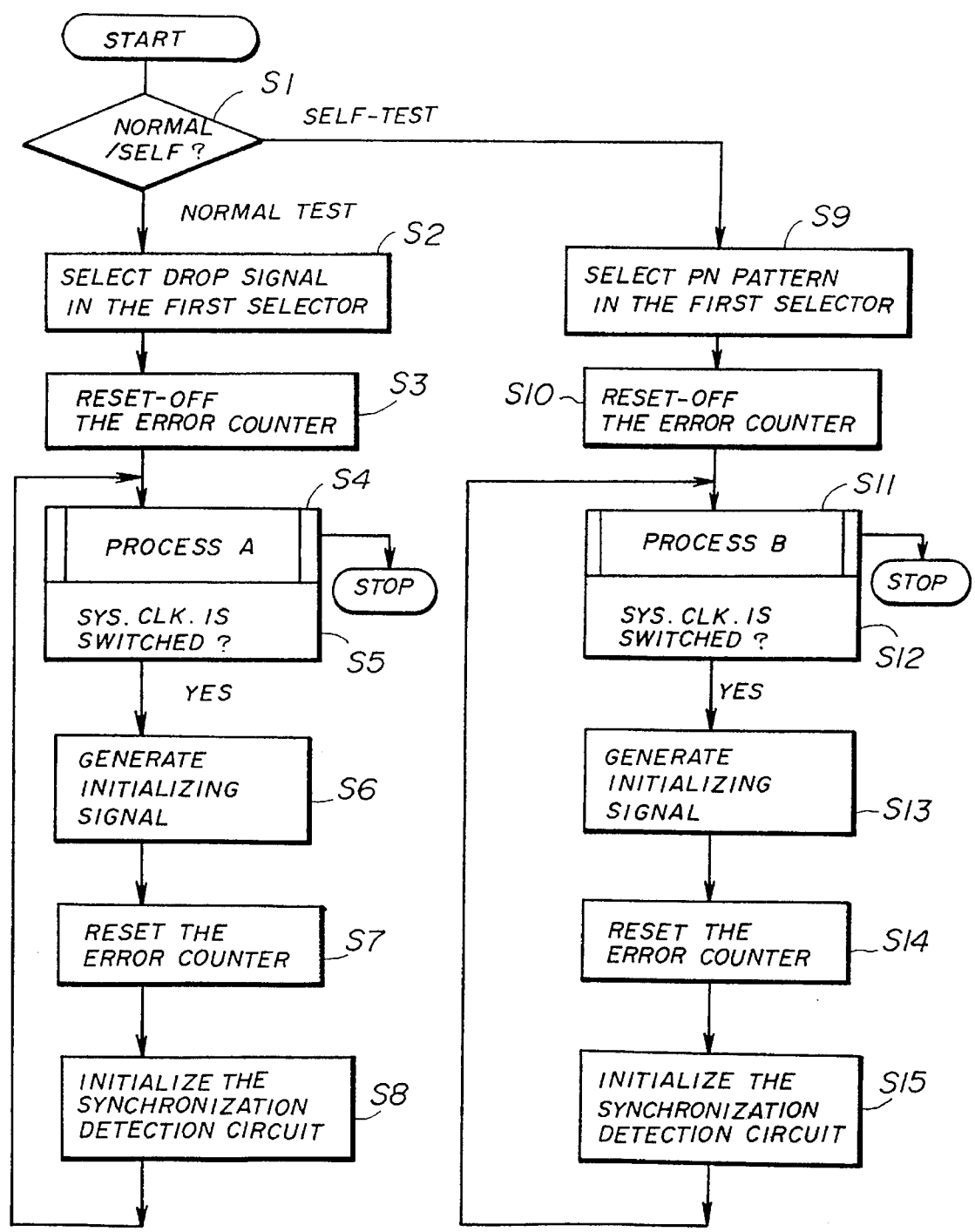
FIG. 13 shows a flowchart for explaining a procedure of the embodiment of the transmission test apparatus in FIG. 6.

FIG. 13 shows a flowchart for explaining a procedure of the embodiment of the transmission test apparatus in FIG. 6.

As shown in FIG. 13, the normal transmission test procedure is described from a step 1 to a step 8, and the self-test procedure is described from a step 9 to a step 15.

Figure 3:
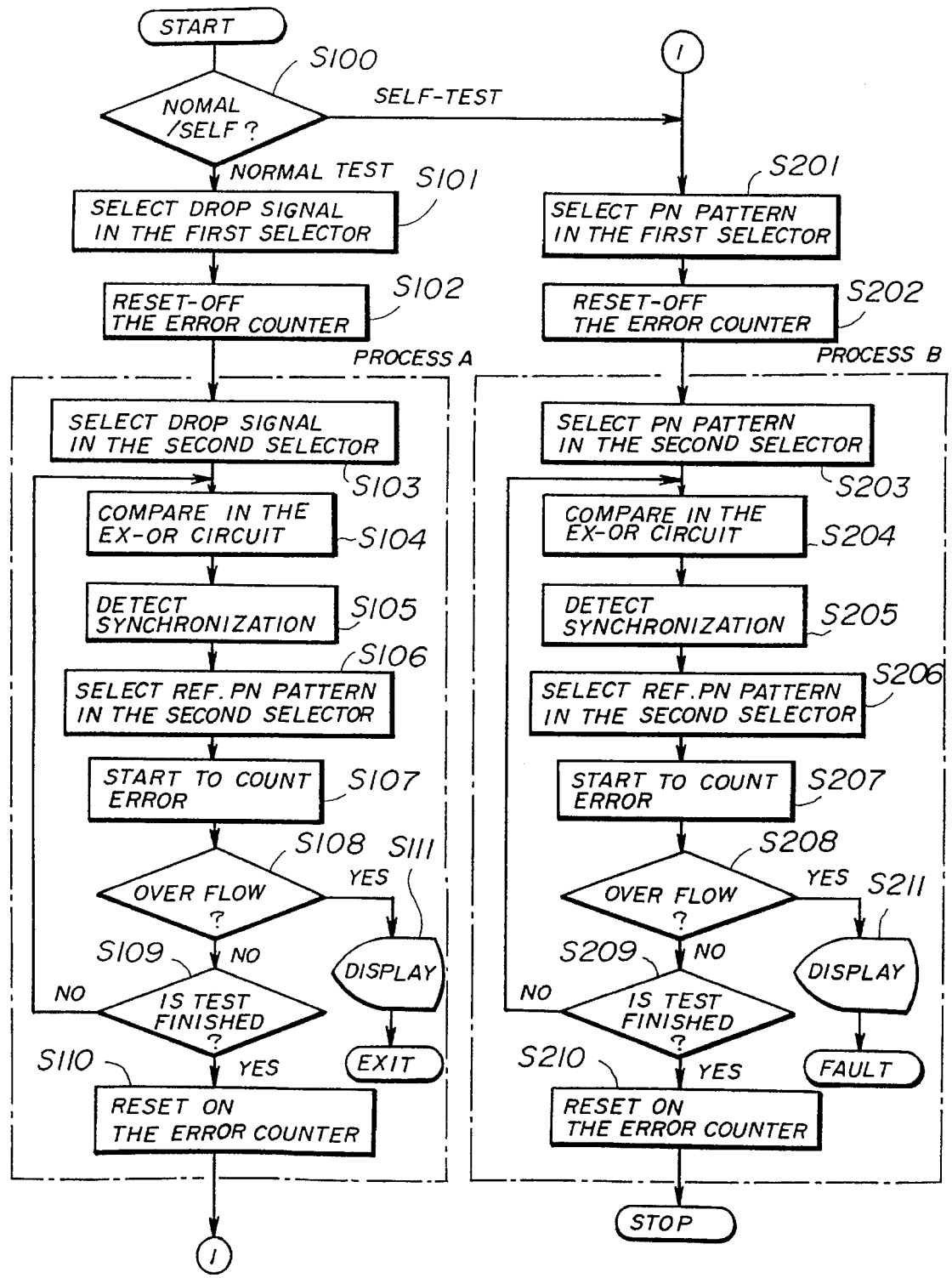
FIG. 3 shows a flowchart for describing an operation of the conventional test circuit.

For the normal transmission test, in general, the steps 1 to 4 are performed in the same way as the procedure shown in FIG. 3. However, when the system-clock is switched (step 5), the procedure escapes from the process A and proceeds to the step 6. In the step 6, the initializing section 280 generates the initializing signal. And subsequently, the initializing signal resets the error counter 240 (step and initializes the synchronization detection circuit 230 (step 8). After the initialization, the process A is returned to. In the process A, first the synchronization is established again through the steps 103 to 106 shown in FIG. 3. In the re-establishment of the synchronization, the error counter 240 starts to count (step 107 in FIG. 3). After that, in the process A, the testing procedures are repeated.

On the other hand, for the self-test, in general the step 1 and the steps 9 to 11 are performed. However, when the system clock is switched (step 12), the procedure escapes from the process B and proceeds to the step 13. In the step 13, the initializing section 280 generates the initializing signal. And subsequently, the initializing signal resets the error counter 240 (step 14) and initializes the synchronization detection circuit 230 (step 15). After the initialization, the process B is returned to. In the process B, first the synchronization is established again through the steps 203 to 206 shown in FIG. 3. In the re-establishment of the synchronization, the error counter 240 starts to count (step 207 in FIG. 3). After that, in the process B, the self-testing procedures are repeated.

When the self test is carried out sequentially after the normal transmission test, the self test is started only by the loop signal. The counter control signal remains at "0" which has been set in the last step (step 110 in FIG. 3) of the normal transmission test procedure. Therefore, in this case, the step 10 in FIG. 13 may be invalid or removable.

In the embodiment described above, the operation of the initializing section has been described by using the examples shown in FIGS. 6 and 8. However, the configuration of the initializing section 280 is not limited to these examples, but another configuration is permitted such that the synchronization detection circuit 230 is initialized in the system-clock switching time, and the synchronization detection is carried out after the switching.

As described above, the present inventions have the following features.

Even if the system clock is switched in the redundancy system, a subsequent transmission test may be continued without producing a false alarm which indicates that a fault occurred in the transmission equipment. Thus, this transmission test apparatus according to the present invention enables the stable transmission test.

Furthermore, the transmission test apparatus according to the present invention also enables the stable self test of the test apparatus, even if the turbulence of the system clock due to the switching occurs during the self test.

Further, the present invention is not limited to these embodiments, but various variations and modifications may be made without departing from the scope of the present invention.

What is claimed is:

1. A transmission test apparatus having a system-clock redundancy system for testing a transmission path, said transmission test apparatus comprising:

a clock switching unit for selecting a proper one from a plurality of system clocks in response to a clock selection signal and supplying a selected system clock;

test-signal check means for performing a synchronization operation in which a first test pattern generated based on said selected system clock in the test-signal check means is synchronized with a test signal coming through said transmission path, which test signal has been formed with the same pattern as the first test pattern, and for comparing the first test pattern with the test signal;

synchronization detection means for detecting a synchronization between said first test pattern and said test signal by examining a comparison result of said test-signal check means and for producing a synchronization detection signal which indicates a synchronous state when detecting the synchronization;

an error counter performing a counting operation in which a number of error bits existing in said comparison result of said test-signal check means is counted after receiving said synchronization detection signal from said synchronization detection means; and initilizing means for generating an initializing signal in response to said clock selection signal to initialize the synchronizing operation in said test-signal check means and the counting operation in said error counter, wherein:

in response to said initializing signal said synchronization detection means initializes the synchronization detecting operation and controls said test-signal check means to carry out the synchronizing operation again by a deactivated synchronization detection signal which indicates an asynchronous state; and said error counter, after being reset by said initializing signal, restarts the counting operation in response to the synchronization detection signal generated again in said synchronization detection means.

2. A transmission test apparatus having a system-clock redundancy system for testing a transmission path, said transmission test apparatus comprising:

a clock switching unit for selecting a proper one from a plurality of system clocks in response to a clock selection signal and supplying a selected system clock;

test-signal check means for performing a synchronization operation in which a first test pattern generated based on said selected system clock in the test-signal check means is synchronized with a test signal coming through said transmission path, which test signal has been formed with the same pattern as the first test pattern, and for comparing the first test pattern with the test signal;

synchronization detection means for detecting a synchronization between said first test pattern and said test signal by examining a comparison result of said test-signal check means and for producing a synchronization detection signal which indicates a synchronous state when detecting the synchronization;

an error counter performing a counting operation in which a number of error bits existing in said comparison result of said test-signal check means is counted after receiving said synchronization detection signal from said synchronization detection means;

initializing means for generating an initializing signal in response to said clock selection signal to initialize the synchronizing operation in said test-signal check means and the counting operation in said error counter;

test-pattern generation means for generating a second test pattern which is formed with the same pattern as said first test pattern based on said selected system clock; and first signal selection means for being capable of supplying said second test pattern coming from said test-pattern generation means, instead of said test signal coming through the transmission path, to said test-signal check means, wherein a self-test of said transmission test apparatus is carried out for selection of said second test pattern, whereas a transmission test of the transmission path is carried out for selection of said test signal, and wherein:

in response to said initializing signal said synchronization detection means initializes the synchronization detecting operation and controls said test-signal check means to carry out the synchronizing operation again by a deactivated synchronization detection signal which indicates an asynchronous state; and said error counter, after being reset by said initializing signal, restarts the counting operation in response to the synchronization detection signal generated again in said synchronization detection means.

3. The transmission test apparatus as claimed in claim 2, wherein said test-signal check means comprises:

a PN pattern generator producing a PN pattern by forming a PN pattern generation loop; and a second signal selection means, included in said PN pattern generation loop in said PN pattern generator, for supplying either a feedback signal of the PN pattern generation loop or a selected signal in said first signal selection means to said PN pattern generator by said synchronization detection signal, wherein said synchronizing operation in said test-signal check means is carried out such that, before receiving the synchronization detection signal which indicates the synchronous state, the second signal selection means selects said selected signal in said first signal selection means, and after receiving the synchronization detection signal the second signal selection means selects said feedback signal to close said PN pattern generation loop and generate said PN pattern as the first test pattern, in which the PN pattern is synchronized to the selected signal in said first signal selection means.

4. The transmission test apparatus as claimed in claim 3, wherein said initializing means receives a counter control signal and produces said initializing signal which is signal-processed with the counter control signal to initialize at least said error counter regardless of said clock selection signal.

5. The transmission test apparatus as claimed in claim 4, wherein said initializing means comprises:

a first mono-multivibrator for generating a single pulse on the rising edge of said clock selection signal supplied to said clock switching means;

a second mono-multivibrator for generating a single pulse on the falling edge of said clock selection signal;

a NOR gate for logically inverting a summation of the outputs of said first mono-multivibrator and said second mono-multi-vibrator; and an AND gate for logically multiplying said counter control signal with the output of said NOR gate and for producing the logical output as said initializing signal.

6. The transmission test apparatus as claimed in claim 4, wherein said initializing means comprises:

a first counter which receives external clock pulses and starts to count the external clock pulses on the rising edge of said clock selection signal until a given number of clock pulses is counted;

a first decoder for producing a single pulse which rises on the rising edge of said clock selection signal and falls at the counting up of the given number of clock pulses in said first counter;

a second counter which receives the external clock and starts to count the external clock pulses on the falling edge of said clock selection signal until a given number of clock pulses is counted;

a second decoder for producing a single pulse which rises on the falling edge of said clock selection signal and falls at the counting up of the given number of clock pulses in said second counter;

a NOR gate for logically inverting a summation of the outputs of said first decoder and said second decoder; and an AND gate for logically multiplying said counter control signal with the output of said NOR gate and for producing the logical output as said initializing signal.

7. A self-test method for testing a transmission test apparatus, said self-test method comprising the steps of:

(a) generating a second test pattern based on a system clock in a test-pattern generation circuit, and supplying directly the second test pattern to a test-signal check circuit;

(b) generating a first test pattern which is synchronized to said second test pattern, based on the system clock in said test-signal check circuit;

(c) comparing said first test pattern with said second test pattern in the test-signal check circuit;

(d) counting a number of unidentified bits, which indicate error bits, in the comparison result of said test-signal check circuit by a counter; and (e) establishing again, when said system clock is switched to another system clock by a selection signal, the synchronization between said first test pattern and said second test pattern in response to the selection signal, and resetting said counter, and after synchronization establishment restarting the counting operation of the counter, wherein:

in response to said selection signal, a synchronization detection operation is initialized to produce a deactivated synchronization detection signal which indicates an asynchronous state and a synchronizing operation is carried out again in said test-signal check circuit by said deactivated synchronization detection signal; and said counter, after being reset by said selection signal, restarts the counting operation in response to a synchronization detection signal generated again by said synchronizing operation.

8. A transmission test method for testing a transmission path, said transmission test method comprising the steps of:

(a) generating a second test pattern based on a system clock in a test-pattern generation circuit, and supplying the second test pattern to a test-signal check circuit through said transmission path to be tested;

(b) generating a first test pattern which is synchronized to said second test pattern, based on the system clock in said test-signal check circuit;

(c) comparing said first test pattern with said second test pattern in the test-signal check circuit;

(d) counting a number of unidentified bits, which indicate error bits, in the comparison result of said test-signal check circuit by a counter; and (e) establishing again, when said system clock is switched to another system clock by a selection signal, the synchronization between said first test pattern and said second test pattern in response to the selection signal, and resetting said counter, and after synchronization establishment restarting the counting operation of the counter, wherein:

in response to said selection signal, a synchronization detection operation is initialized to produce a deactivated synchronization detection signal which indicates an asynchronous state and a synchronizing operation is carried out again in said test-signal check circuit by said deactivated synchronization detection signal; and said counter, after being reset by said selection signal, restarts the counting operation in response to a synchronization detection signal generated again by said synchronizing operation.

* * * * *